United States Patent
Hsu et al.

(10) Patent No.: US 10,600,732 B1
(45) Date of Patent: Mar. 24, 2020

(54) SEMICONDUCTOR DEVICE AND METHOD FOR FABRICATING THE SAME

(71) Applicant: United Microelectronics Corp., Hsinchu (TW)

(72) Inventors: Min-Shiang Hsu, Kaohsiung (TW); Yu-Han Tsai, Kaohsiung (TW); Yi-Hsiu Chen, Pingtung County (TW); Chih-Sheng Chang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/122,807

(22) Filed: Sep. 5, 2018

(51) Int. Cl.
*H01L 29/40* (2006.01)
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/76829* (2013.01); *H01L 21/76877* (2013.01); *H01L 23/53295* (2013.01)

(58) Field of Classification Search
CPC ............. H01L 23/5226; H01L 23/5329; H01L 23/53295; H01L 21/76877; H01L 21/76802; H01L 21/76831; H01L 21/76807; H01L 27/14636; H01L 2224/19; H05K 3/4038
See application file for complete search history.

(56) References Cited

U.S. PATENT DOCUMENTS

| | | |
|---|---|---|
| 6,350,672 B1 | 2/2002 | Sun |
| 9,685,368 B2 | 6/2017 | Tsai et al. |
| 2018/0190603 A1* | 7/2018 | Chang ............... H01L 24/03 |

OTHER PUBLICATIONS

Benjamin D. Briggs et al., "Fully Aligned via Integration for Extendibility of Interconnects to Beyond the 7 nm Node", IEDM17-338, Dec. 2017, pp. 1-4.

* cited by examiner

*Primary Examiner* — Hsien Ming Lee
(74) *Attorney, Agent, or Firm* — J.C. Patents

(57) ABSTRACT

A structure of semiconductor device includes a substrate. An interconnection layer is formed on the substrate including a first inter-layer dielectric (ILD) layer over the substrate. A lower wiring structure is formed in the ILD layer. A hard mask layer is disposed on the first ILD layer. The hard mask layer has a first opening and a second opening being adjacent to expose the lower wiring structure. A second ILD layer is disposed on the hard mask layer. The second ILD layer has a via opening aligned to the first opening of the mask layer and a trench pattern connecting with the via opening. The second ILD layer has a protruding portion to fill the second opening of the mask layer. A metal line layer fills the via opening and the trench pattern in the second ILD layer and the first opening of the hard mask layer.

20 Claims, 8 Drawing Sheets

SEMICONDUCTOR DEVICE AND METHOD FOR FABRICATING THE SAME

BACKGROUND

1. Field of the Invention

The present invention generally relates to semiconductor fabrication technology, and particularly to the structure and fabrication method for the semiconductor device with interconnect structure.

2. Description of Related Art

As integration of integrated circuit is significantly improved, the device size is accordingly reduced. In addition, in order to keep high integration over the available area of the substrate for forming the device, some structures are formed by the manner of stacking up in the vertical direction to the wafer.

The different wiring layers at different levels are connected through the via structure at the connection nodes. However, once the device size is greatly reduced, the via structure is rather close to the neighbouring lower wire. If the mechanical strength of the dielectric material to support the wiring line is insufficient, the via structure would possibly contacts to the neighbouring lower wire, causing a circuit short.

How to improve the structure of inter-layer dielectric layer, so to well support the interconnection structure is still an issue to further look into and solve.

SUMMARY OF THE INVENTION

In accordance with embodiments, the invention provides structure and fabrication method for the semiconductor device, in which the via structure in the interconnection layer can be well supported with less possibility of circuit short.

In an embodiment, the invention provides a structure of semiconductor device includes a substrate, wherein an interconnection layer is formed on the substrate. The interconnection layer comprises a first inter-layer dielectric layer, disposed over the substrate. A lower wiring structure is formed in the first inter-layer dielectric layer. A hard mask layer is disposed on the first inter-layer dielectric layer. The hard mask layer has a first opening and a second opening being adjacent to expose the lower wiring structure. A second inter-layer dielectric layer is disposed on the hard mask layer. The second inter-layer dielectric layer has a via opening aligned to the first opening of the mask layer and a trench pattern connecting with the via opening. The second inter-layer dielectric layer has a protruding portion to fill the second opening of the mask layer. A metal line layer fills the via opening and the trench pattern in the second inter-layer dielectric layer and the first opening of the hard mask layer.

In an embodiment, as to the structure of semiconductor device, the first inter-layer dielectric layer is a single layer.

In an embodiment, as to the structure of semiconductor device, the first inter-layer dielectric layer comprises multiple layers as a stacked layer.

In an embodiment, as to the structure of semiconductor device, the first inter-layer dielectric layer comprises: a nitrogen-doped SiC (NDC) layer, disposed on the substrate; a tetraethoxysilane (TEOS) layer, disposed on the NDC layer; and a low-k dielectric layer, disposed on the TEOS layer.

In an embodiment, as to the structure of semiconductor device, the lower wiring structure in the first inter-layer dielectric layer are same height to the first inter-layer dielectric layer.

In an embodiment, as to the structure of semiconductor device, the hard mask layer has a predetermined thickness to determine a depth of the first opening and the second opening of the hard mask layer.

In an embodiment, as to the structure of semiconductor device, the second inter-layer dielectric layer is a single-layer structure.

In an embodiment, as to the structure of semiconductor device, the second inter-layer dielectric layer is a multiple-layer structure.

In an embodiment, as to the structure of semiconductor device, the second inter-layer dielectric layer comprises: an etching stop layer, disposed on the hard mask layer; a tetraethoxysilane (TEOS) layer disposed on the etching stop layer; and a low-K dielectric layer on the TEOS layer. The via opening penetrates through the low-K dielectric layer, the TEOS layer and the etching stop layer to expose the lower wiring structure and the trench pattern is in the low-K dielectric layer.

In an embodiment, as to the structure of semiconductor device, the metal line layer comprises a via in the via opening to contact with the lower wiring structure, and a trench metal line to fill the trench pattern.

In an embodiment, the invention also provides a method for fabricating semiconductor device. The method comprises providing a substrate and forming an interconnection layer on the substrate. The interconnection layer is formed comprising forming a first inter-layer dielectric layer over the substrate. A lower wiring structure is formed in the first inter-layer dielectric layer. A hard mask layer is formed on the first inter-layer dielectric layer. The hard mask layer is patterned to have a first opening and a second opening being adjacent to expose the lower wiring structure. A second inter-layer dielectric layer is formed on the hard mask layer, wherein the second inter-layer dielectric layer has a protruding portion to fill the first opening and the second opening of the mask layer. The second inter-layer dielectric layer is patterned to have a via opening aligned to the first opening of the mask layer and a trench pattern connecting with the via opening. A metal line layer is formed in the second inter-layer dielectric layer, filling the via opening and the trench pattern and the first opening of the hard mask layer.

In an embodiment, as to the method for fabricating semiconductor device, the first inter-layer dielectric layer is a single layer.

In an embodiment, as to the method for fabricating semiconductor device, the first inter-layer dielectric layer comprises multiple layers as a stacked layer.

In an embodiment, as to the method for fabricating semiconductor device, the first inter-layer dielectric layer is formed comprising: forming a nitrogen-doped SiC (NDC) layer on the substrate; forming a tetraethoxysilane (TEOS) layer on the NDC layer; and forming a low-k dielectric layer on the TEOS layer.

In an embodiment, as to the method for fabricating semiconductor device, a polishing process is performed on the lower wiring structure and the first inter-layer dielectric layer to have same height.

In an embodiment, as to the method for fabricating semiconductor device, the hard mask layer has a predetermined thickness to determine a depth of the first opening and the second opening of the hard mask layer.

In an embodiment, as to the method for fabricating semiconductor device, the second inter-layer dielectric layer is a single-layer structure.

In an embodiment, as to the method for fabricating semiconductor device, the second inter-layer dielectric layer is a multiple-layer structure.

In an embodiment, as to the method for fabricating semiconductor device, the step of forming the second inter-layer dielectric layer comprises: forming an etching stop layer on the hard mask layer; forming a tetraethoxysilane (TEOS) layer on the etching stop layer; and forming a low-K dielectric layer on the TEOS layer. The via opening penetrates through the low-K dielectric layer, the TEOS layer and the etching stop layer to expose the lower wiring structure and the trench pattern is in the low-K dielectric layer.

In an embodiment, as to the method for fabricating semiconductor device, the metal line layer comprises a via in the via opening to contact with the lower wiring structure, and a trench metal line to fill the trench pattern.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the fabrication technology of semiconductor device. The semiconductor device usually includes an interconnection layer with multiple metal layers in different levels, so to connect the elements, such transistors, to form the integrated circuit as intended. The invention has looked into the structure of interconnection layer.

The interconnection layer has a three-dimensional structure, including a lower metal line and the upper metal line, and a via, located at a proper position to connect the lower metal line and the upper metal line, in an example. However, the adjacent via may get circuit short to other part of the lower metal line when the upper metal line is formed over the lower metal line and connected to the lower metal line through via. This situation is more obvious as the device size is greatly reduced.

Figure 1:
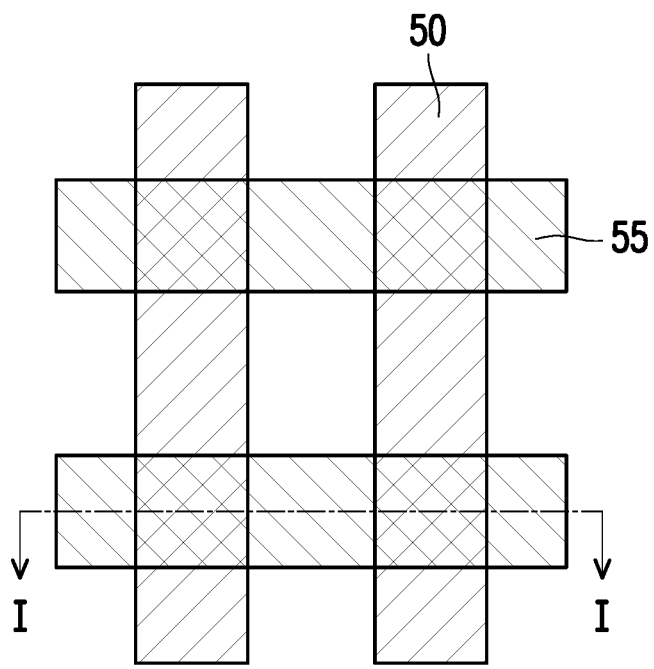
FIG. 1 is a drawing, schematically illustrating a layout of interconnect structure, according to an embodiment of the invention as looked into.
Figure 2:
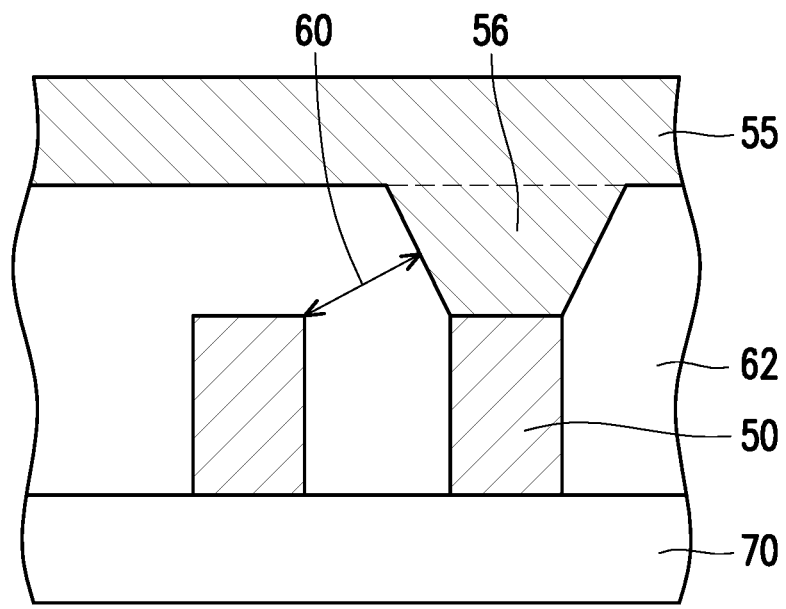
FIG. 2 is a drawing, schematically illustrating a cross-sectional structure along a cutting line I-I in FIG. 1, according to an embodiment of the invention.

FIG. 1 is a drawing, schematically illustrating a layout of interconnect structure, according to an embodiment of the invention as looked into. FIG. 2 is a drawing, schematically illustrating a cross-sectional structure along a cutting line I-I in FIG. 1, according to an embodiment of the invention.

Referring to FIG. 1 and FIG. 2, the structure of an interconnection layer of a semiconductor device includes a lower metal lines 50 and an upper metal lines 55, which usually are horizontally extending in the individual layers in different directions over a substrate 70, in an example. The connection between the lower metal lines 50 and the upper metal lines 55 at the connection node by a via 56, extending along a vertical direction. When the device size is greatly reduced, the horizontal area occupied by the interconnection layer is accordingly reduced. In this situation, a distance 60 between the via 56 and the adjacent lower metal line 50 gets smaller. However, if the mechanical strength to support the via 56 is insufficient, the via 56 may be easily connecting to the adjacent lower metal line 50, causing a circuit short. The fabrication of the semiconductor device then gets fail.

To increase the mechanical strength as looked into above, the vias 50 may be formed to be lower than the peripheral dielectric layer, so to have a shallow recess and further an etching stop layer on the shallow recess, so to avoid the electrical short between the lower metal line 50 and the adjacent one of the via 56 to the lower metal line 50. However, the recess above is formed by further removing a top portion of the metal line, reducing the thickness in other words. This fabrication manner above is based on reducing the thickness of the lower metal line 50.

In the invention as proposed after at least looking into the issues above, it is not necessary to form a recess by reducing the thickness of the lower metal line.

Several embodiments are provided for describing the invention. However, the invention is not just limited to.

Figure 3:
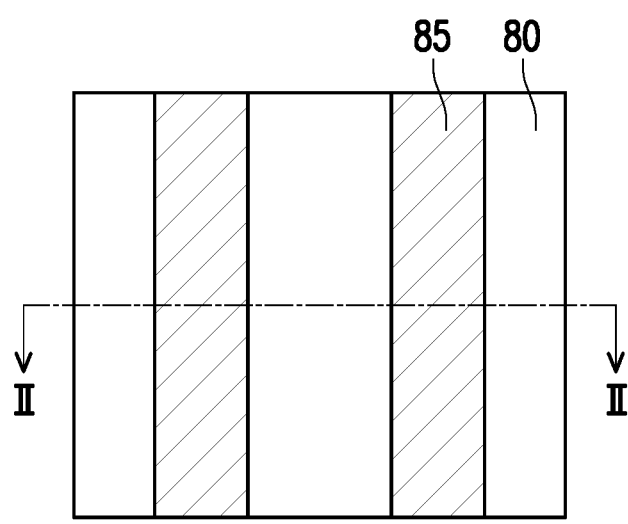
FIG. 3 is a drawing, schematically illustrating a layout of a lower metal layer of an interconnect structure, according to an embodiment of the invention.

FIG. 3 is a drawing, schematically illustrating a layout of a lower metal layer of an interconnect structure, according to an embodiment of the invention. FIG. 4A-FIG. 4I are drawings of cross-sectional structure cutting along the line II-II indicated in FIG. 3 crossing over the interconnection layer, schematically illustrating a fabrication process for an interconnection layer, according to an embodiment of the invention.

Figure 4A:
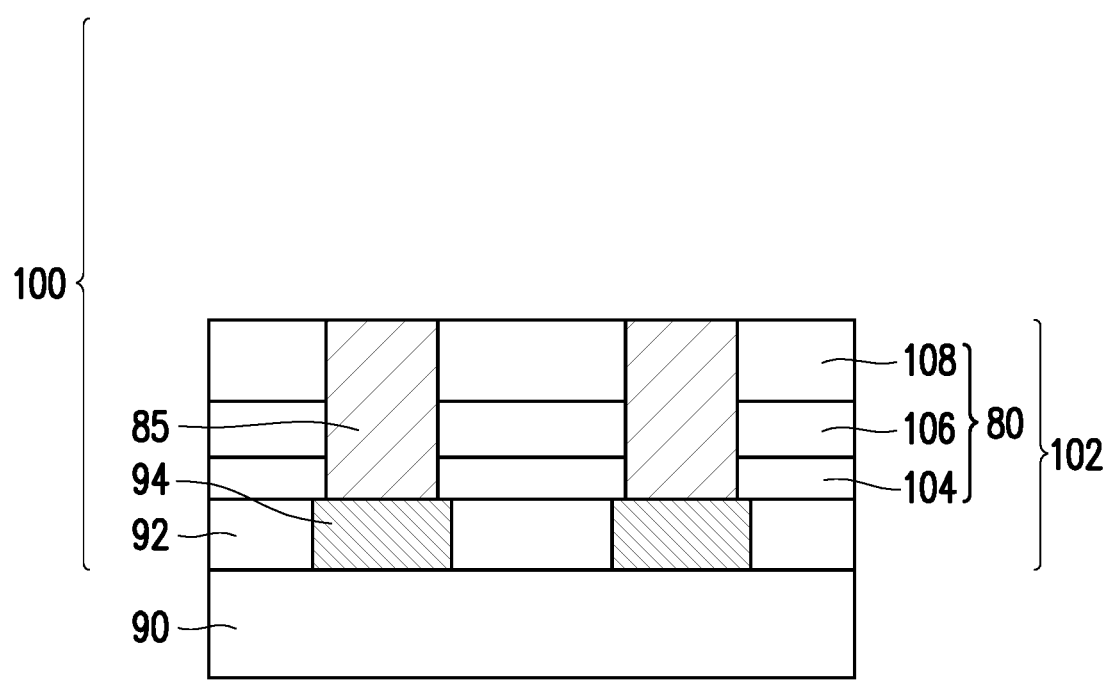
FIG. 4A-FIG. 4I are drawings of cross-sectional structure cutting along the line II-II indicated in FIG. 3 crossing over the interconnection layer, schematically illustrating a fabrication process for an interconnection layer, according to an embodiment of the invention.

Referring to FIG. 4A with FIG. 3, a substrate 90 is provided as a base structure. The substrate 90 in an example is a silicon substrate. However, the substrate 90 may have already been formed with sub-structures. An interconnection layer 100 is to be eventually formed over the substrate 90 as to be fully shown in FIG. 4I. The interconnection layer 100 includes an inter-layer dielectric layer 102 serving as the lower part. Another inter-layer dielectric layer 128 is to be subsequently formed as to be seen from FIG. 4F.

The inter-layer dielectric layer 102 is fabricated in an example including forming a lower metal line 94 in a dielectric layer 92. An interconnection structure 85 is formed in another dielectric layer 80 over the dielectric layer 92 to contact to the lower metal line 94. The interconnection structure 85 with the lower metal line 94 is a part of a lower wiring structure, which is generally referring to the necessary interconnection structure in actual need without limiting to the interconnection structure 85 with the lower metal line 94. Due to the actual fabrication stages, the dielectric layer 80 may include multiple dielectric layers 104, 106, 108 in different materials as actual need or a single-layer structure, without limiting thereto.

As see above, the inter-layer dielectric layer 102 is a lower part of the interconnection layer 100 for any connection structure as designed. Then, another inter-layer dielectric layer 128 (seen in FIG. 4I), serving as an upper part of the interconnection layer 100 to be subsequently formed.

Figure 4B:
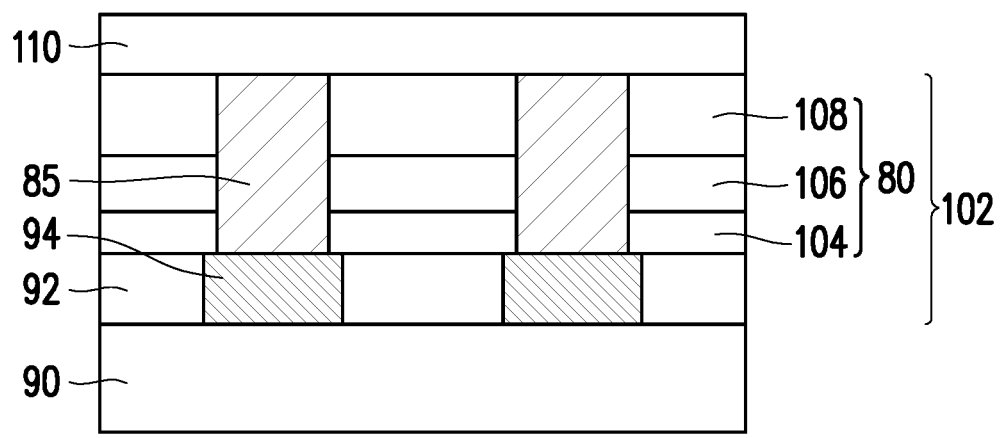

Referring to FIG. 4B, a mask layer 110 is formed over the inter-layer dielectric layer 102. The mask layer 110 in an example servers as a hard mask layer, relatively hard to the inter-layer dielectric layer 102, so the material of the mask layer 110 can be aluminium nitride as an example.

Figure 4C:
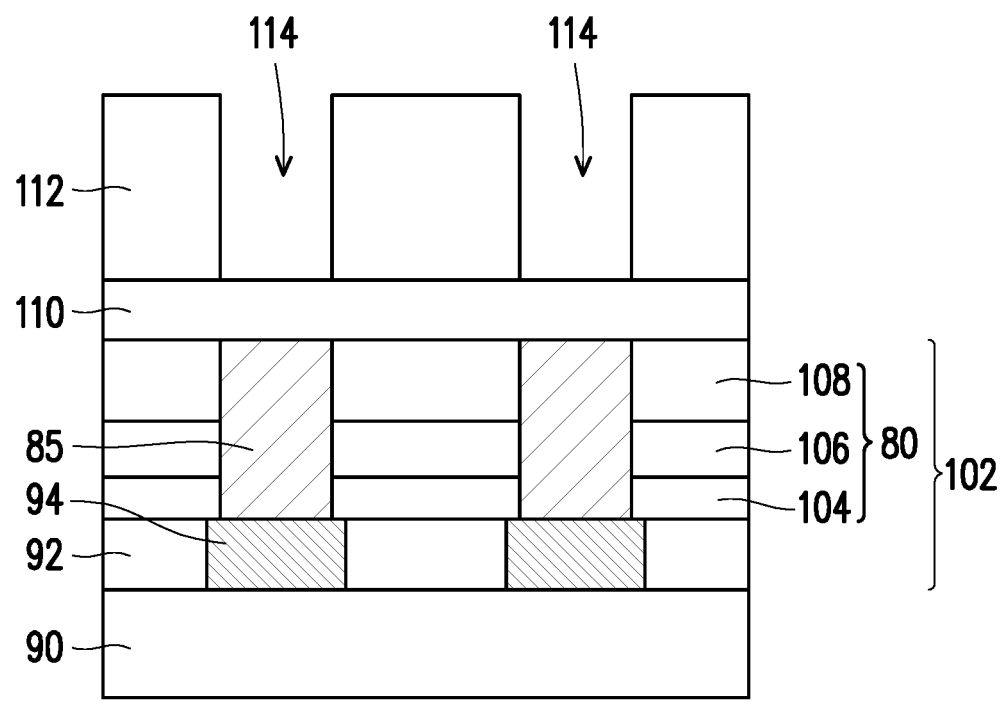

Referring to FIG. 4C, a photoresist layer 112 with an opening 114 is formed on the mask layer 110. The opening 114 exposes a portion of the mask layer 110 corresponding to the locations of the interconnection structure 85.

Figure 4D:
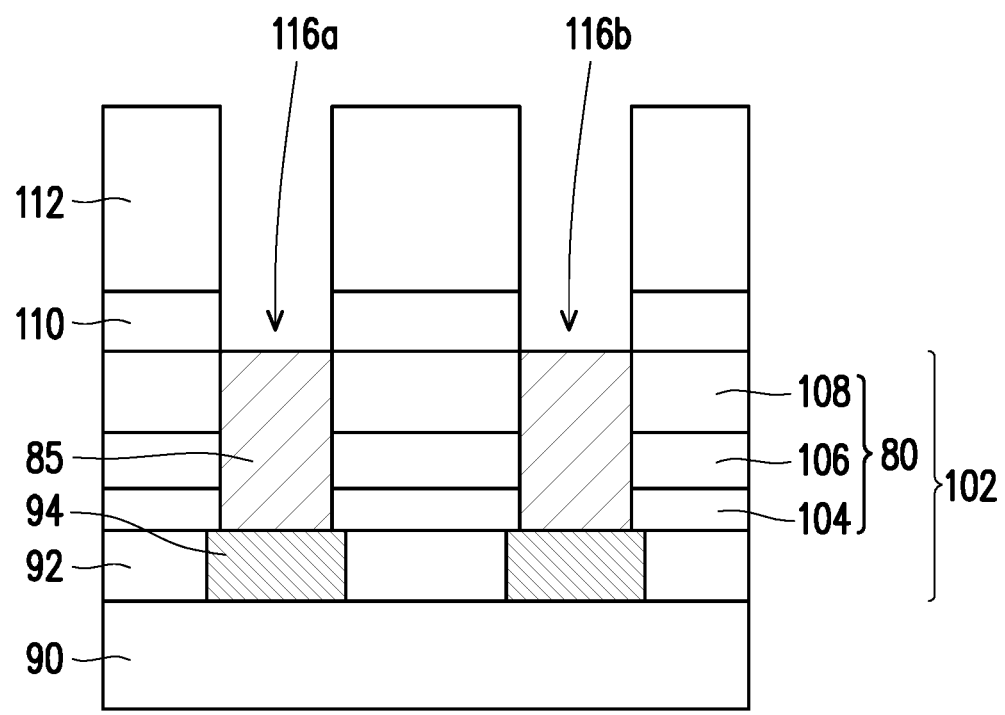

Referring to FIG. 4D, the photoresist layer 112 with an opening 114 is used as an etching mask, then an etching process is performed to etch the exposed portion of the mask layer 110, so to form the opening 116a, 116b in the mask layer 110 to expose the interconnection structure 85.

Figure 4E:
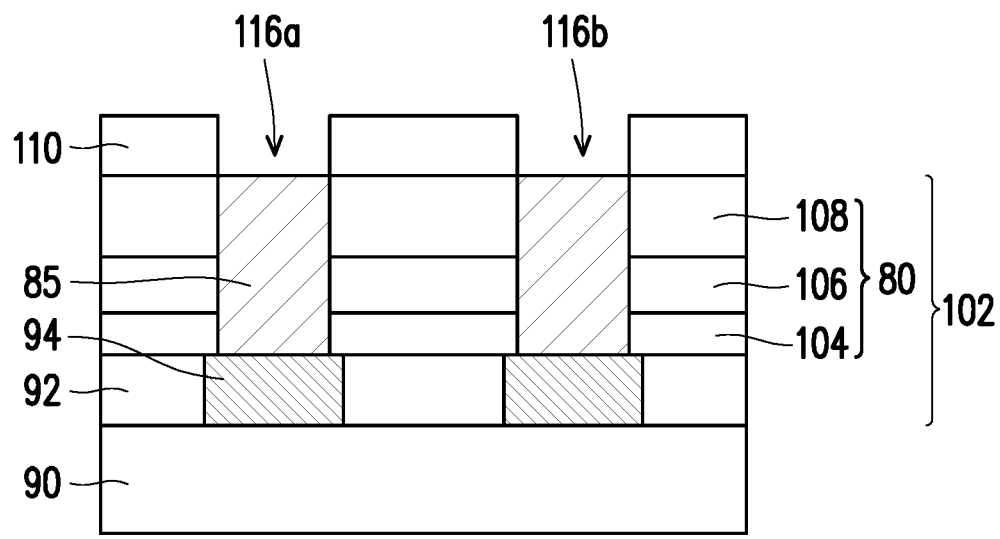

Referring to FIG. 4E, the photoresist layer 112 is removed to further expose the mask layer 110, which has the openings 116a, 116b to correspondingly expose the interconnection structure 85. As remarkably noted, a top portion of the interconnection structure 85 is not necessary to be removed to have the recess. The openings 116a, 116b of the mask layer 110 provide the recess over the interconnection structure 85.

Figure 4F:
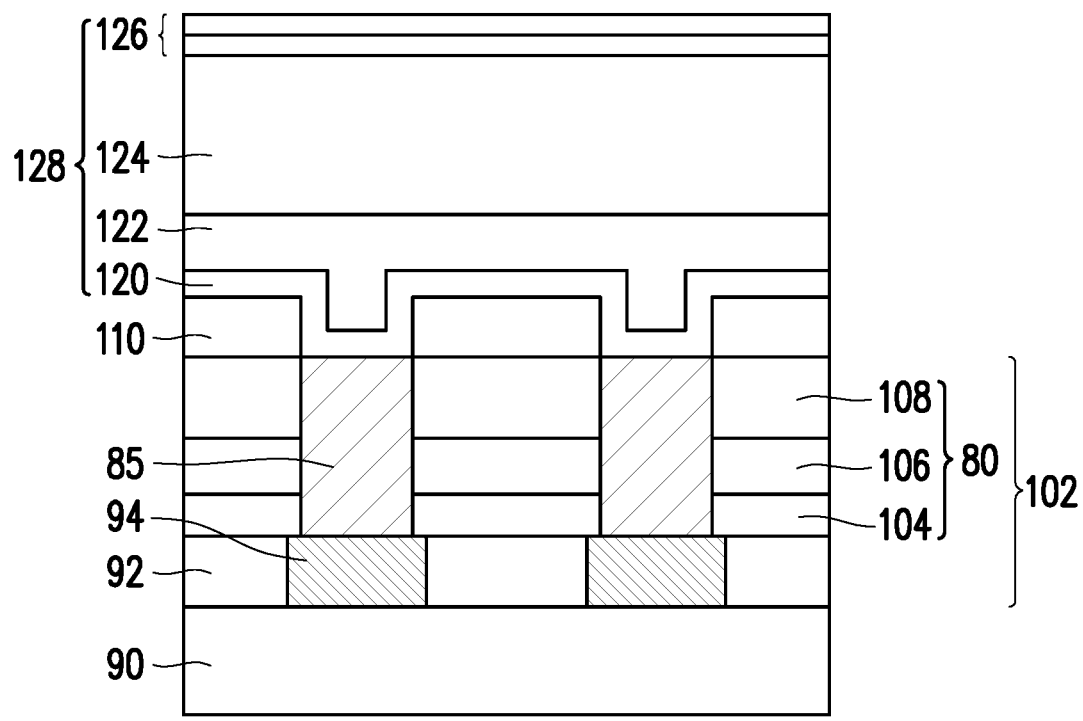

Referring to FIG. 4F, another inter-layer dielectric layer 128 is formed over the mask layer 110. The inter-layer dielectric layer 128 can be a stacked layer from multiple dielectric layers in different materials. In an example, the inter-layer dielectric layer 128 can include an etching stop layer 120, a TEOS layer 122, a dielectric layer 124, and a mask layer 126. The mask layer 126 can even include multiple layers. However, the stack of the inter-layer dielectric layer 128 is not limited to the example. The inter-layer dielectric layer 128 is used to subsequently form an upper wiring structure inside, so to connect to the interconnection structure 85 of the lower wiring structure.

Figure 4G:
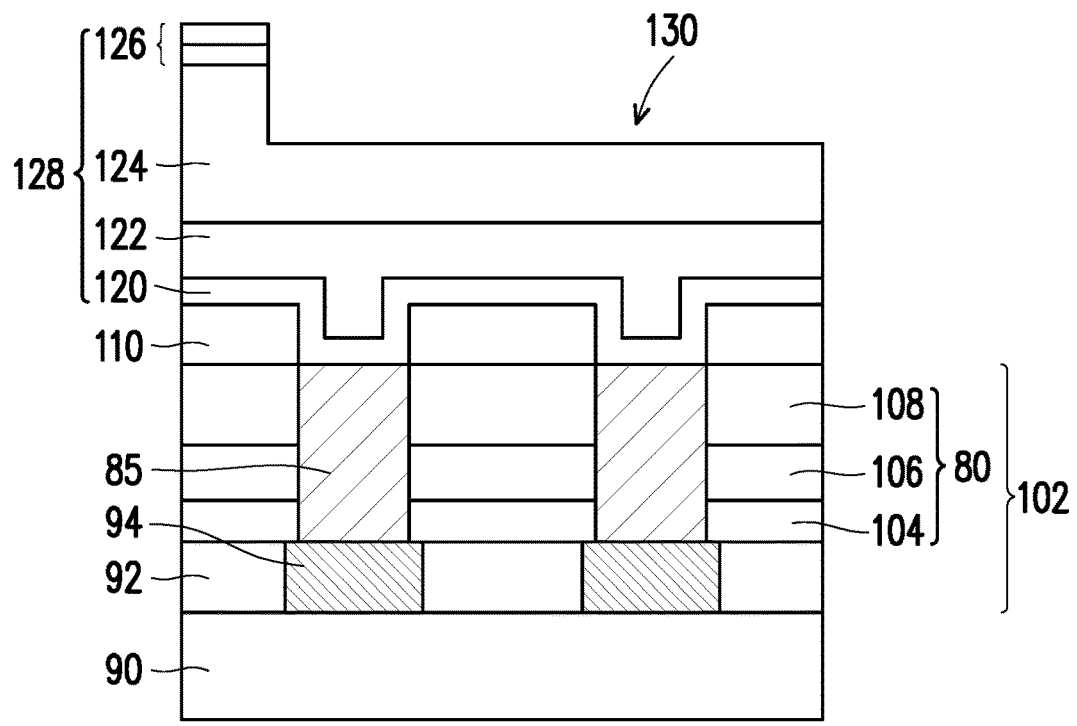

Referring to FIG. 4G, a trench pattern 130 is formed in the inter-layer dielectric layer 128 at the top portion by a patterning process at a first stage. The trench pattern 130 is corresponding to a pattern of an upper metal line structure to be formed later. The trench pattern 130 may stop in the dielectric layer 124.

Figure 4H:
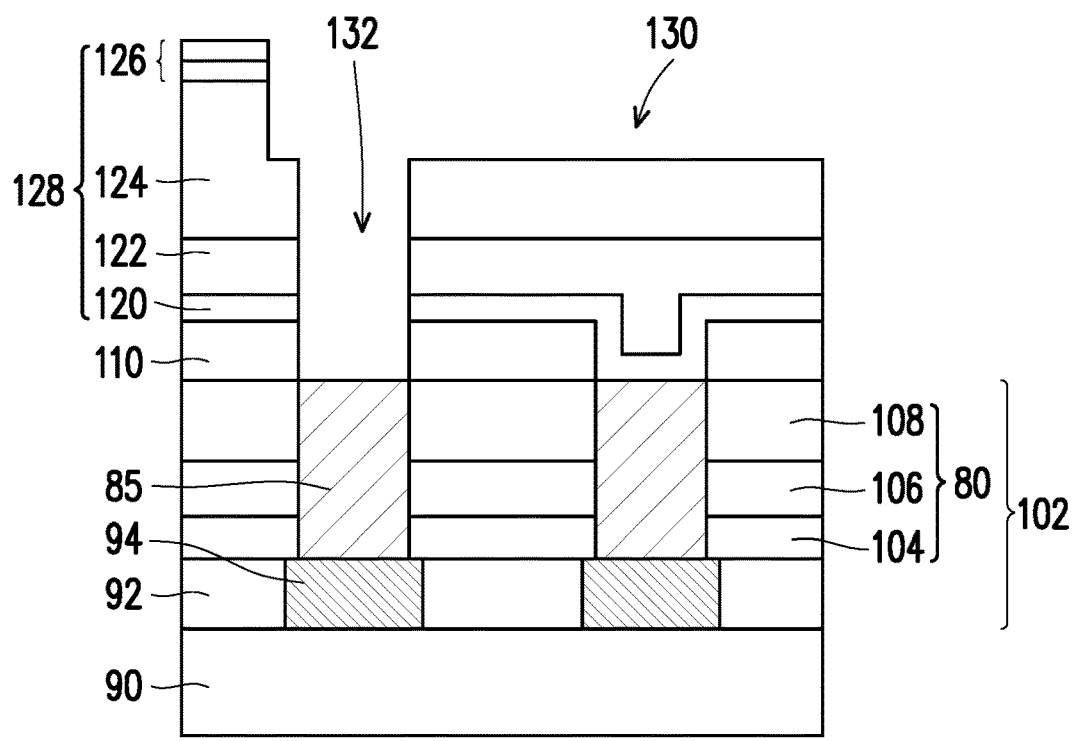

Referring to FIG. 4H, a via opening 132 is then further formed in the inter-layer dielectric layer 128 by another patterning process at a second stage, so to expose the intended part of the interconnection structure 85. The trench pattern 130 and the via opening 132 are connected together as a mixed opening. The via opening 132 is aligned to the intended portion of the interconnection structure 85 in the lower wiring structure.

Figure 4I:
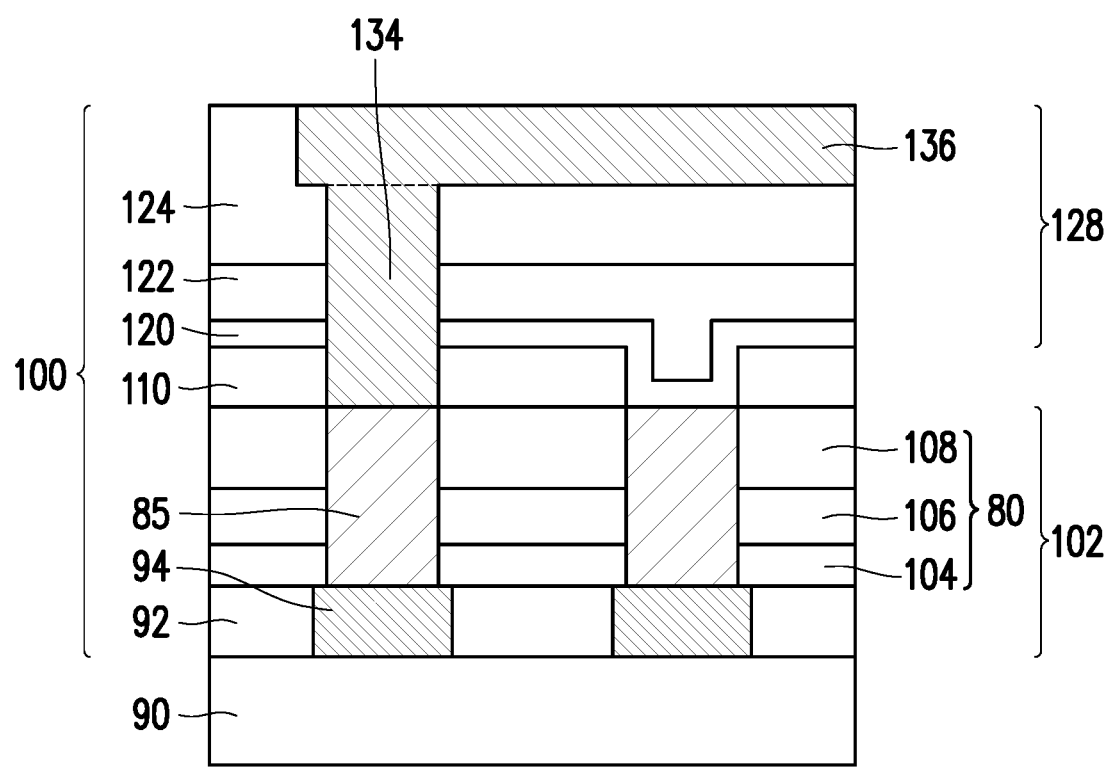

Referring to FIG. 4I, a metal line 136 including a via 134 is formed in the inter-layer dielectric layer 128 to fill the trench pattern 130 and the via opening 132. As a result, the metal line 136 has a structure being extending horizontally and also including the via 134 extending vertically.

As noted, the via 134 indeed contacts the interconnection structure 85 of the lower wiring structure. The mask layer 110 provides mechanical strength to support the metal line 136 with the via 134. The via 134 has a significantly less probability to contact to the adjacent interconnection structure 85 of the lower wiring structure. inter-layer dielectric layer 128 also includes a protruding portion to fill the opening 116b of the mask layer 110 to really insulate interconnection structure 85 at this region.

In the structure of FIG. 4I, the interconnection layer 100 including the inter-layer dielectric layer 102, the mask layer 110, and the inter-layer dielectric layer 128 is then formed over the substrate 90. The intended wiring structure is formed in the interconnection layer 100, wherein the bottom portion of the via 134 is additionally supported by the mask layer 110. The mask layer 110 provides the additional mechanical strength to effective avoid electric short, occurring between the via and the interconnection structure.

Figure 5:
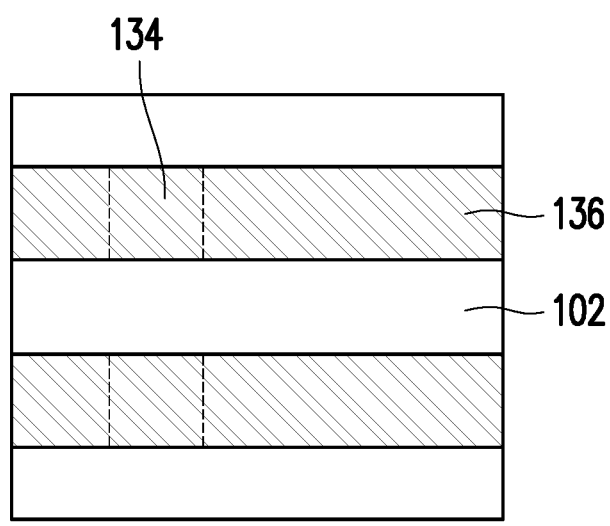
FIG. 5 is a drawing, schematically illustrating a layout of an upper metal layer of the interconnect structure, according to an embodiment of the invention.

FIG. 5 is a drawing, schematically illustrating a layout of an upper metal layer of the interconnect structure, according to an embodiment of the invention. Referring to FIG. 5, the layout of the metal line 136 over the inter-layer dielectric layer 102 in an example is extending along a direction different from the direction, similarly shown in FIG. 3. The upper metal line and the lower metal line are connected at the predetermined node by the via 134. Additionally, the bottom portion of the via 134 is protected by the mask layer 110. The probability to contact to the adjacent lower wiring structure can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of semiconductor device, comprising:
   a substrate, wherein an interconnection layer is formed on the substrate, the interconnection layer comprises:
   a first inter-layer dielectric layer, disposed over the substrate;
   a lower wiring structure, formed in the first inter-layer dielectric layer;
   a hard mask layer, disposed on the first inter-layer dielectric layer, wherein the hard mask layer has a first opening and a second opening being adjacent to expose the lower wiring structure;
   a second inter-layer dielectric layer disposed on the hard mask layer, wherein the second inter-layer dielectric layer has a via opening aligned to the first opening of the mask layer and a trench pattern connecting with the via opening, wherein the second inter-layer dielectric layer has a protruding portion to fill the second opening of the mask layer; and
   a metal line layer, filling the via opening and the trench pattern in the second inter-layer dielectric layer and the first opening of the hard mask layer.

2. The structure of semiconductor device in claim 1, wherein the first inter-layer dielectric layer is a single layer.

3. The structure of semiconductor device in claim 1, wherein the first inter-layer dielectric layer comprises multiple layers as a stacked layer.

4. The structure of semiconductor device in claim 3, wherein the first inter-layer dielectric layer comprises:
   a nitrogen-doped SiC (NDC) layer, disposed on the substrate;
   a tetraethoxysilane (TEOS) layer, disposed on the NDC layer; and
   a low-k dielectric layer, disposed on the TEOS layer.

5. The structure of semiconductor device in claim 1, wherein the lower wiring structure in the first inter-layer dielectric layer are same height to the first inter-layer dielectric layer.

6. The structure of semiconductor device in claim 1, wherein the hard mask layer has a predetermined thickness to determine a depth of the first opening and the second opening of the hard mask layer.

7. The structure of semiconductor device in claim 1, wherein the second inter-layer dielectric layer is a single-layer structure.

8. The structure of semiconductor device in claim 1, wherein the second inter-layer dielectric layer is a multiple-layer structure.

9. The structure of semiconductor device in claim 8, wherein the second inter-layer dielectric layer comprises:
an etching stop layer, disposed on the hard mask layer;
a tetraethoxysilane (TEOS) layer disposed on the etching stop layer; and
a low-K dielectric layer on the TEOS layer,
wherein the via opening penetrates through the low-K dielectric layer, the TEOS layer and the etching stop layer to expose the lower wiring structure and the trench pattern is in the low-K dielectric layer.

10. The structure of semiconductor device in claim 1, wherein the metal line layer comprises a via in the via opening to contact with the lower wiring structure, and a trench metal line to fill the trench pattern.

11. A method for fabricating semiconductor device, comprising:
providing a substrate; and
forming an interconnection layer on the substrate, wherein the interconnection layer is formed comprising:
forming a first inter-layer dielectric layer over the substrate;
forming a lower wiring structure in the first inter-layer dielectric layer;
forming a hard mask layer on the first inter-layer dielectric layer;
patterning the hard mask layer to have a first opening and a second opening being adjacent to expose the lower wiring structure;
forming a second inter-layer dielectric layer on the hard mask layer, wherein the second inter-layer dielectric layer has a protruding portion to fill the first opening and the second opening of the mask layer;
patterning the second inter-layer dielectric layer to have a via opening aligned to the first opening of the mask layer and a trench pattern connecting with the via opening; and
forming a metal line layer in the second inter-layer dielectric layer, filling the via opening and the trench pattern and the first opening of the hard mask layer.

12. The method for fabricating semiconductor device in claim 11, wherein the first inter-layer dielectric layer is a single layer.

13. The method for fabricating semiconductor device in claim 11, wherein the first inter-layer dielectric layer comprises multiple layers as a stacked layer.

14. The method for fabricating semiconductor device in claim 13, wherein the first inter-layer dielectric layer is formed comprising:
forming a nitrogen-doped SiC (NDC) layer on the substrate;
forming a tetraethoxysilane (TEOS) layer on the NDC layer; and
forming a low-k dielectric layer on the TEOS layer.

15. The method for fabricating semiconductor device in claim 11, wherein a polishing process is performed on the lower wiring structure and the first inter-layer dielectric layer to have same height.

16. The method for fabricating semiconductor device in claim 11, wherein the hard mask layer has a predetermined thickness to determine a depth of the first opening and the second opening of the hard mask layer.

17. The method for fabricating semiconductor device in claim 11, wherein the second inter-layer dielectric layer is a single-layer structure.

18. The method for fabricating semiconductor device in claim 11, wherein the second inter-layer dielectric layer is a multiple-layer structure.

19. The method for fabricating semiconductor device in claim 18, wherein the step of forming the second inter-layer dielectric layer comprising:
forming an etching stop layer on the hard mask layer;
forming a tetraethoxysilane (TEOS) layer on the etching stop layer; and
forming a low-K dielectric layer on the TEOS layer,
wherein the via opening penetrates through the low-K dielectric layer, the TEOS layer and the etching stop layer to expose the lower wiring structure, and the trench pattern is in the low-K dielectric layer.

20. The method for fabricating semiconductor device in claim 11, wherein the metal line layer comprises a via in the via opening to contact with the lower wiring structure, and a trench metal line to fill the trench pattern.

* * * * *